(12) United States Patent
Ebsen et al.

(10) Patent No.: US 9,299,402 B2
(45) Date of Patent: Mar. 29, 2016

(54) MOBILE PERSONALIZED BOOT DATA (71) Applicant: Seagate Technology LLC, Cupertino, CA (US)

(72) Inventors: David Scott Ebsen, Minnetonka, MN (US); Ara Patapoutian, Hopkinton, MA (US); Michael Joseph Steiner, Saint Paul, MN (US); Kevin Arthur Gomez, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 424 days.

(21) Appl. No.: 13/762,853

(22) Filed: Feb. 8, 2013

(65) Prior Publication Data

US 2014/0229665 A1 Aug. 14, 2014

(51) Int. Cl.
*G06F 12/00* (2006.01)
*G11C 7/10* (2006.01)
*G06F 9/44* (2006.01)

(52) U.S. Cl.
CPC ............ *G11C 7/1072* (2013.01); *G06F 9/4401* (2013.01); *G06F 9/4416* (2013.01)

(58) Field of Classification Search
CPC .. G06F 12/0246; G06F 3/0679; G11C 16/102
USPC ........................................................ 711/103
See application file for complete search history.

(56) References Cited

U.S. PATENT DOCUMENTS

| | | | |
|---|---|---|---|
| 7,191,327 B2 | 3/2007 | Viljoen et al. | |
| 7,295,462 B2 | 11/2007 | Farnworth | |
| 7,506,335 B1 | 3/2009 | Wooff et al. | |
| 7,539,048 B2 | 5/2009 | Farnworth | |
| 7,797,525 B2 | 9/2010 | Lee et al. | |
| 7,873,059 B2 | 1/2011 | Morita et al. | |
| 8,027,207 B2 | 9/2011 | Fifield et al. | |
| 8,028,155 B1 | 9/2011 | Righi et al. | |
| 8,095,851 B2 | 1/2012 | Diggs et al. | |
| 8,159,869 B2 | 4/2012 | Park et al. | |
| 8,199,603 B2 | 6/2012 | Chung et al. | |
| 8,533,329 B2 * | 9/2013 | Hammell et al. | 709/225 |
| 8,639,917 B1 * | 1/2014 | Ben-Shaul et al. | 713/2 |
| 2003/0050974 A1 * | 3/2003 | Mani-Meitav et al. | 709/203 |
| 2003/0172135 A1 | 9/2003 | Bobick et al. | |
| 2008/0162843 A1 * | 7/2008 | Davis et al. | 711/162 |
| 2010/0023870 A1 | 1/2010 | Baker | |

(Continued)

FOREIGN PATENT DOCUMENTS

TW   201126417 A * 8/2011 ................ G06F 9/44

OTHER PUBLICATIONS

Lee, et al., "A fast, high-endurance and scalable non-volatile memory device made from asymmetric Ta2O5_x/TaO2_x bilayer structures," Nature Materials, Jul. 10, 2011, pp. 1-6, DOI: 10.1038/NMAT3070; Macmillan Publishers Limited.

*Primary Examiner* — Charles Rones
*Assistant Examiner* — Nanci Wong
(74) *Attorney, Agent, or Firm* — Hall Estill Attorneys at Law (57) ABSTRACT A system and associated method of using may generally have at least a mobile data storage device with a controller directing data to first and second tiers of memory. The first tier of memory can have at least boot data pre-fetched from the second tier of memory with the boot data including at least metadata and personalized user data.

19 Claims, 4 Drawing Sheets

(56) References Cited

U.S. PATENT DOCUMENTS

| | | |
|---|---|---|
| 2010/0027327 A1 | 2/2010 | Chung et al. |
| 2011/0075473 A1 | 3/2011 | Park et al. |
| 2011/0188292 A1 | 8/2011 | Joo et al. |
| 2011/0320690 A1* | 12/2011 | Petersen et al. ............... 711/103 |
| 2012/0023282 A1* | 1/2012 | Rub .............................. 711/103 |
| 2012/0260159 A1 | 10/2012 | Lazier et al. |
| 2012/0284230 A1 | 11/2012 | Adkins et al. |
| 2013/0132638 A1* | 5/2013 | Horn et al. .................... 711/103 |
| 2014/0075136 A1* | 3/2014 | Davies .......................... 711/159 |

* cited by examiner

MOBILE PERSONALIZED BOOT DATA

SUMMARY

Various embodiments are generally directed to a mobile data memory environment capable of being personalized to predetermined operating systems.

In accordance with various embodiments, a mobile data storage device with a controller may direct data to first and second tiers of memory. The first tier of memory can have at least boot data pre-fetched from the second tier of memory with the boot data including at least metadata and personalized user data.

DETAILED DESCRIPTION

With continued expansion of the size and sophistication of computing networks, data from a plethora of different host operating systems can clutter a data storage device. Such clutter can increase the time it takes a network node to boot either initially or after a power loss. The proliferation of varying forms of personalized data, like encryption keys, passwords, and identification, corresponding to different host operating systems can further slow booting times as security measures are taken to protect the personalized data transferred to the network node. As such, there is an increasing industry demand for personalized data management systems capable of decreasing network node boot times while raising protection of the personalized data.

Accordingly, various embodiments can generally be constructed and operated with a mobile data storage device that has a controller directing data to first and second tiers of memory with the first tier of memory having at least boot data pre-fetched from the second tier of memory and the boot data including at least metadata and personalized user data. The pre-fetching of boot data from various locations to a common memory tier can provide efficient network node start-up while allowing personalized data to be loaded, but not stored at the node for added data security. The ability to configure such boot data management in mobile data storage devices, like thumb and Universal Serial Bus (USB) drives, can allow for fast and secure network node access from anywhere on the network.

Figure 1:
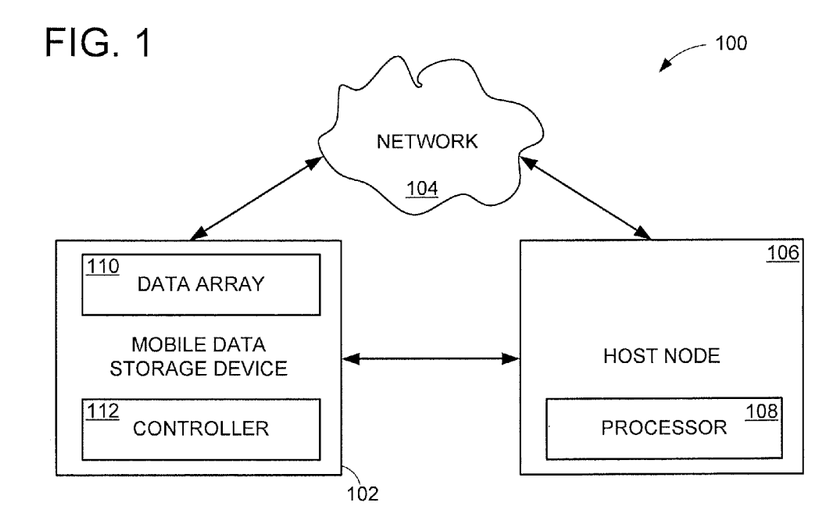
FIG. 1 is a top view block representation of an example data storage network constructed and operated in accordance with various embodiments.

While boot data management can be practiced in any number of non-limiting data storage environments, FIG. 1 generally illustrates a block representation of an example data storage system 100 that can utilize a mobile data storage device 102 in accordance with various embodiments. A data storage network 104, as shown, can connect the mobile data storage device 102 to a host node 106 that can be physically positioned anywhere, including mobile and stationary computing environments. The mobile data storage device 102 and host node 106 may be part of the data storage network 104 and can either be directly connected, such as physically touching, and can be logically connected through non-local network protocol.

The mobile data storage device 102, host node 106, and network 104 may each have a processor 108 and data array 110 that allows the respective components to operate without being connected to other network components. In some embodiments, the mobile data storage device 102 has a controller 112 that provides access to a data array 110 locally present on the device 102 to a non-local processor 108, such as the processor 108 shown on the host node 106. As such, the host node 106 can conduct organizational and intelligence operations for the data array 110 across the network 104.

As a practical non-limiting example, a thumb drive mobile data storage device can be plugged into a local network access point, like a computer hub, that connects to a virtual network node via wired or wireless data telecommunication protocol. Typically, such a thumb drive network connection would allow a non-local processor to access and load personalized user data, like passwords, and metadata corresponding to a particular operating system or universal metadata capable of providing limited operating access. However, such remote access and loading of personalized data can be time consuming and compromise the security and integrity of sensitive data.

Figure 2:
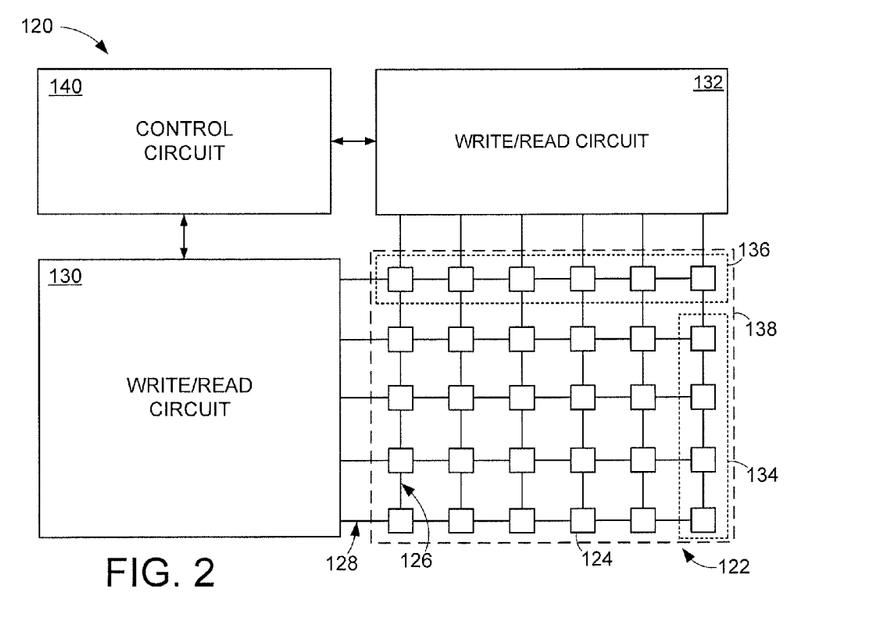
FIG. 2 provides a block representation of an example data storage array capable of being used in the data storage system of FIG. 1.

With such remote data access speed and security concerns in mind, a metadata and personalized user data management scheme can allow efficient and secure remote booting of physical and virtual network nodes. Such a scheme can be present in local or non-local volatile and non-volatile memory and accessed by local and remote evaluation and control circuitry. FIG. 2 displays a block representation of an example control portion 120 of a mobile data storage device capable of being used individually and as part of a data system like the system 100 of FIG. 1.

A data storage device may be constructed as one or a multitude of separate die and chips that operate together to store data. The control portion 120 of FIG. 2 illustrates an example data array 122 along with various data programming, evaluation, and reading circuitry that can be a part or the entirety of a data storage device. The data array 122, as shown, can have a number of non-volatile memory cells 124 arranged in rows and columns that correspond with the overlapping of electrical paths 126 and 128, such as bit and source lines, in an orientation that can be characterized as a crosspoint array. One or more write/read circuits 130 and 132 can individually or concurrently control data being written to and read from selected memory cells 124 arranged in sectors 134, pages 136, blocks 138, and garbage collection units. Such control may be conducted with respect to multiple cells, such as an entire row, page, and block, singularly or successively to expedite data accesses.

In a non-limiting example operation, the write/read circuits 130 and 132 may concurrently provide access to page 136 or sector 134 of memory cells for scheduled or unscheduled user and overhead system operations. One or more control circuits 140 may provide row and column testing and operation capabilities that are monitored, recorded, and evaluated continually or periodically. Such testing can be associated with placing one or more memory cells 124 in predetermined states, such as in a common logical and resistance values, that may or may not be online for user access while one or more quiescent currents pass through the selected memory cells 124 to identify and differentiate one or more different types of cell defects, operating parameters, and types of memory. That is, a memory cell 124 may be taken offline and set to a testing mode by the control 140 and write/read circuits 130 and 132 to allow a plurality of testing currents to be passed through the cell 124 to determine a variety of biographical, operational, and defective characteristics that are logged and evaluated to identify operational trends.

As such, the control circuit 140 may direct operation of the write/read 130 and 132 circuits to determine what and how memory cells 124 are operating. In some embodiments, the control circuit 140 conducts evaluation and testing of some or all of the memory cells 124 prior to user data ever being written, which can provide baseline factory operating parameters set during manufacturing. Various embodiments further can continually and periodically conduct tests and evaluations of the operating characteristics of various memory cells 122 to identify the type and function of data being stored in the memory array 122, which can allow the characterization of data with respect to host operating systems, network protocol, and security procedures.

With the ability to evaluate and identify data stored in the memory array 122, the control circuit 140 can organize data to enhance the efficiency of data seek, load, and, system boot times. Such data organization may further be enhanced by the utilization of different types of memory cells that provide different data access parameters, such as programming times, load times, and access currents. Thus, the control circuit 140 may be configured with a variety of capabilities to allow for the predictive organization of memory cells 124 based on observed operational tests and trends to cater memory array 122 operation to maximize data performance, such as system boot times.

Figure 3:
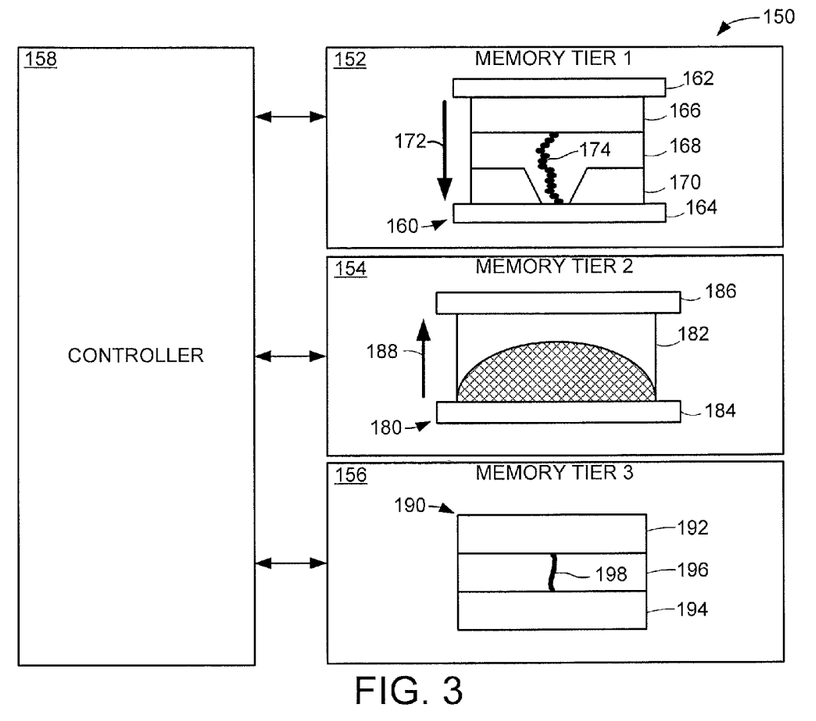
FIG. 3 shows a block representation of a portion of an example mobile data storage constructed in accordance with some embodiments.

FIG. 3 illustrates a block representation of an example memory tier portion 150 of a data storage device in accordance with various embodiments. The memory tier portion 150 has a plurality of different memory tiers 152, 154, and 156 that are individually and collectively operated through controller 158. In various embodiments, the various memory tiers correspond with different memory cell types, as shown. The first memory tier 152 can be constructed and operated with the illustrated programmable metallization cell (PMC) element 160. The PMC element 160 may be formed with top 162 and bottom 164 electrodes, a metal layer 166, an electrolyte layer 168, and a dielectric layer 170. The controller 158 can be used to adjust the relative voltage potential between the first 162 and second 164 electrodes, resulting in passage of a write current 172 through the PMC element 160 to form a filament 174 that changes the resistance of the cell from a high resistance to a low resistance that can correspond to a first predetermined logic state, such as 1.

The filament 174 establishes an electrically conductive path between the metal layer 166 and the bottom electrode 164 by the migration of ions from the metal layer 166 and electrons from the bottom electrode 164. The dielectric layer 170 focuses a small area of electron migration from the bottom electrode 164 in order to control the position of the resulting filament 174. Subsequent application of a write current, in an opposite second direction, through the PMC element 160 causes migration of the ions and electrons back to the respective electrodes 162 and 164 to reset the PMC element 160 to its initial high electrical resistance that corresponds with a different second predetermined logic state, such as 0. PMC elements with a construction similar to that shown at 160 can alternatively be programmed using unipolar programming currents of different magnitudes and/or pulse widths that are selectively provided by the controller 158.

The second memory tier 154 is shown with another non-exclusive type of solid-state memory capable of being used in a data storage array in accordance with various embodiments. The example phase change random access memory (PCRAM) element 180 has a phase change layer 182 disposed between top 184 and bottom 186 electrodes. While not required or limiting, the phase change layer 182 can be formed of a polycrystalline chalcogenide material of group VI of the periodic table, such as Tellurium (Te) and Selenium (Se), while in some embodiments, the phase change layer 182 is formed of $Ge_2Sb_2Te_5$ (GST) or In—Ge—Te.

To place the layer 182 into a relatively high resistance amorphous phase, a fairly high voltage potential is applied across the electrodes 184 and 186 to heat the layer 182 above its melting temperature. The voltage is removed rapidly so as to provide a relatively sharp cooling transition, which may be referred to as a quenching process. In such case, the atoms may not have sufficient time to relax and fully array into a crystalline lattice structure, thereby ending in a metastable amorphous phase and high resistance.

The phase change layer 182 can be programmed to a crystallized phase in response to joule heating caused by the passage of a suitable current 188 of relatively lower magnitude and longer duration through the element 180. The applied pulse is configured to raise the temperature of the layer so as to be above its glass transition temperature and below its melting temperature, and to gradually decrease in temperature back to ambient level. Such temperature gradient will generally provide sufficient dwell time for the material to crystallize. With the programming operation of the PCRAM element 180, data writing currents to place the layer 182 in the respective amorphous and crystalline phases can both be applied in a common direction (uniform polarity) 188, which may provide optimized data programming performance in some data storage arrays.

While the same types of solid-state memory can be used in multiple different memory tiers, the non-limiting embodiment displayed in FIG. 3 has a resistive random access memory (RRAM) element 190 utilized singularly or frequently in the third memory tier 156. The RRAM element 190 has opposing metal or metal alloy electrode layers 192 and 194 that are separated by an intervening oxide layer 196. A first, higher resistance programmed state is established by the nominal electrical resistance of the oxide layer 196. Application of a suitable write voltage potential and/or write current in a selected direction across the element 190 can induce metal migration from the electrode layer 192 and the formation of one or more electrically conductive metallization filaments 198 through the oxide layer 196.

Such filaments 198 generally operate to lower the characteristic resistance of the element 190 and provide different high and low resistance states that can correspond to different logic states. To return the programmed state of the element 190 to a high resistance state, an appropriate write voltage potential and/or current is applied between the electrodes 192 and 194 in a direction that rescinds the filament 198. The creation and subsequent removal of the filament 198 can be less than 10 ns with a 30 µA or less writing current, which may optimize data storage array performance by being implemented alone or in combination with other types of solid-state memory and assigned to operating conditions, such as user data, metadata, and spare cells, that maximize the element's 190 relatively fast programming time and low programming current.

The configuration of multiple different memory tiers can allow for the controller 158 to employ sophisticated data management schemes in which the respective memory tiers 152, 154, and 156 have different memory types, like RRAM, PCRAM, and PCM, but similar memory cell functions, such as metadata and storage of user data, which the controller 158 can selectively utilize to optimize data storage performance. For instance, data initially stored in the first memory tier 152 that is constructed as phase change memory cells can be moved to the RRAM memory cells of the second memory tier 154 to take advantage of the operating differences between the two types of memory, such as data loading speed.

Figure 4:
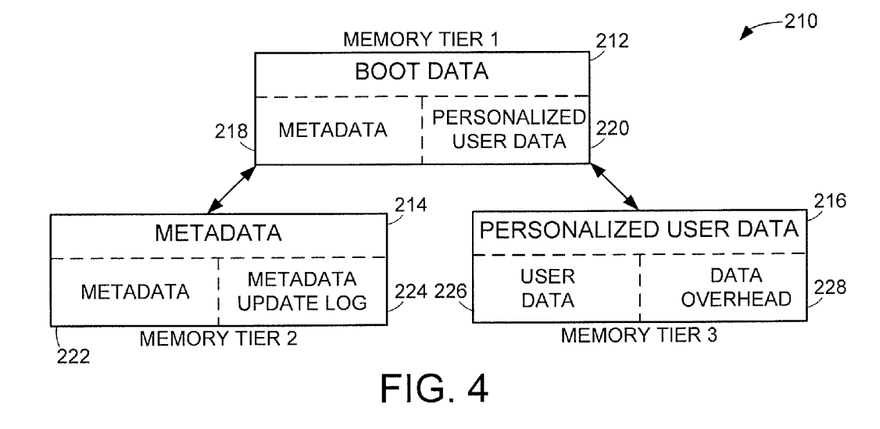
FIG. 4 displays a block representation of various memory tier portions of an example data storage device constructed in accordance with various embodiments.

FIG. 4 provides a block representation of a portion 210 of an example mobile data storage device employing multiple different memory tiers 212, 214, and 216 to organize and manage various data types in accordance with various embodiments. As displayed, the first memory tier 212 is organized as system boot data with both metadata 218 and personalized user data 220. Such organization can allow for efficient loading of data from a single memory tier as opposed to seeking and loading multiple different memory tiers to a temporary cache before outputting and booting a connected system.

While the boot metadata 218 and personalized user data 220 can originate in the first memory tier 212, a controller, such as controller 158 of FIG. 3, can distribute boot data from other sources, like the second 214 and third 216 memory tiers. More specifically, the second memory tier 214 may be configured to hold metadata 222 and at least one metadata update log 224 while the third memory tier 216 comprises both user data 226 and various data overhead 228, such as ECC and forward pointers. Some embodiments exclusively segregate data into metadata and user data memory tiers, as shown, to allow efficient data seek and loading speeds as pages and blocks of similar data can be simultaneously accessed. However, the conglomeration of metadata and user data in one or more memory tiers can also occur, which can lengthen data seek and load times as particular metadata and user data are parsed from extraneous data stored in logically or physically adjacent portions of the memory tier.

Hence, the loading of metadata 218 and personalized user data 220 associated with system booting into a common memory tier 212 can decrease data processing expense and booting time as the entire memory tier 212 can be quickly loaded without an intervening filtering of superfluous data. The combination of metadata 218 and user data 220 in a common memory tier 212 can also allow for predictive pre-fetching of data that has been identified as potential or actual boot data based on observed operational trends. That is, host data accesses, updates, and sequences can be tracked to predict that data in either the second 214 or third 216 memory tiers will be requested during a subsequent host boot session and that identified data is then proactively relocated or copied to the boot data memory tier 212.

Such predictive data loading capabilities can provide almost immediate system boot times, such as times of less than a second, as data from the first memory tier 212 is consolidated and can be burst loaded by a host upon initial physical or network connection. The efficient outputting of multiple sectors, pages, and blocks of data can allow the dedicated metadata 218 and personalized user data 220 boot data tier 212 to be accessed by a remote host with minimal data seek and caching latencies that are common when boot specific metadata and user data are dispersed among other types of data.

The ability to proactively pre-fetch boot data into the first memory tier 212 can increase the security and integrity of personalized user data 226 when the first memory tier 212 is part of a separate data storage device than the second 214 and third 216 memory tiers. That is, the first memory tier 212 can be a mobile data storage device, like a thumb drive, to which user data 226 and metadata 222 from non-mobile physical locations are predictively pre-fetched to allow the mobile device to load the metadata and user data needed to boot a network node without transferring any sensitive data away from the mobile device. In contrast, access to network nodes can correspond to loading metadata and user data stored remotely, such as in a cloud computing environment, which makes the data susceptible to data theft, tampering, and copying. As a non-limiting practical example, a USB drive loaded with metadata and user data predicted to be requested during a host node boot operation is efficiently loaded, but not transferred to the network, in response to connection of the USB drive to the network in which the host node resides.

In some embodiments, the boot data memory tier 212 is segregated into portions that correspond to particular host operating systems. With a variety of host operating systems requesting different types, sizes, and sequences of metadata and personalized user data, segregating metadata and user data into predetermined portions of the memory tier 212 can provide efficient loading of boot data with minimal data seek time. While the use of universal metadata that can be utilized during boot operations for multiple different host operating systems may be employed, various embodiments cater metadata to specific operating systems to optimize boot times by reducing any metadata conversion and processing that may be associated with loading universal metadata.

Figure 5:
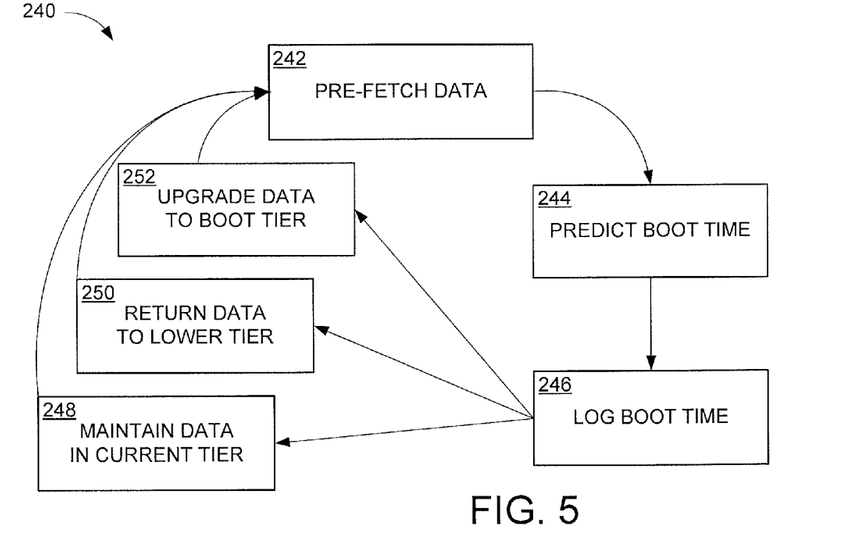
FIG. 5 maps an example pre-fetch loop conducted in accordance with various embodiments.

Regardless of the metadata and user data configuration in the boot data memory tier 212, the pre-fetching of boot specific data into a common memory tier can take advantage of previously experienced data access trends to continually improve host boot times. FIG. 5 provides a logical map of an example pre-fetching loop 240 that is conducted in accordance with some embodiments to maximize system booting efficiency. As metadata and/or personalized user data is pre-fetched in step 242 based upon identified trends in prior data accesses, one or more algorithms can compute a predicted future boot time for the pre-fetched data. Such computation may consider the size of the various pieces of boot data, the type of memory in which the boot data is stored, and previously tracked operating system boot latency to predict a boot speed and range of boot times in step 244.

Subsequently, step 246 logs the actual boot time of a host node from inaccessible to capable of user manipulation. A comparison of the predicted boot time and speed from step 244 with the actual boot time from step 246 can advance the loop 240 to one of three boot data management operations. First in step 248, if the logged boot time is less than a predetermined threshold, such as equal to the predicted time in step 244, the pre-fetched boot data is maintained in the current boot tier. If the logged boot time is above a minimum threshold, like equal to the predicted boot time, but below a maximum threshold, such as 10% greater than predicted, step 250 can return the pre-fetched boot data to a lower tier of memory, which may be removal of the boot data from a mobile storage device to a non-mobile storage environment.

Finally, if the logged boot time exceeds the predicted result, such as 10% faster than predicted boot time, step 252 upgrades the pre-fetched boot data to a higher tier of memory.

As can be appreciated, the pre-fetching loop 240 can utilize multiple boot data sub-tiers to provide a boot data hierarchy which predicted boot data ascends with successive boot times that exceed modeling expectations. The use of multiple boot data sub-tiers can further allow a plurality of different boot data combinations to be stored and tested to continually improve boot data pre-fetching.

The monitoring and management of pre-fetched boot data can also allow the boot data memory tier to adapt to changing operating systems and system boot requests. For example, a software patch to a host node operating system can modify the type, size, and volume of metadata and personalized user data for booting, which the pre-fetching loop 240 can evolve to accommodate by adding, removing, and keeping boot data until a minimum boot time is achieved and maintained. As another example, the use of a new host node operating system can be adapted to by the pre-fetching loop 240 without having prior boot system data. That is, with no previous boot data, the predicted boot time of step 244 would be skipped until a database of boot statistics can produce accurate booting speed and time estimations.

Figure 6:
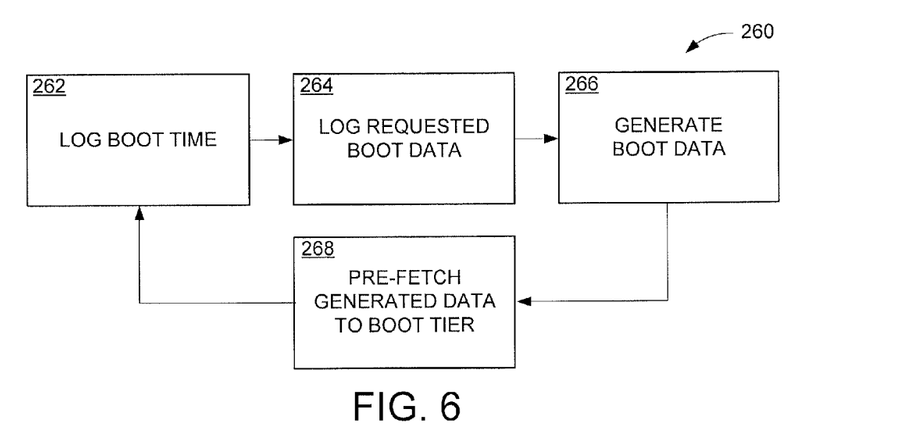
FIG. 6 is a logic map of an example boot data generation loop performed in accordance with some embodiments.

The pre-fetching of data in loop 240 may be complemented by boot data manipulation where a controller combines, creates, or modifies existing boot data to minimize booting complexity and elapsed boot time. FIG. 6 illustrates an example boot data manipulation loop 260 that can operate at scheduled times, such as idle processing times, and from local or remote physical locations to evaluate boot data and times to identify possible manipulations that could increase booting efficiency. Initially, step 262 logs boot times for a particular host node operating system while step 264 logs at least the requested personal user data requested by the operating system.

While not required as a boot data manipulation may not be possible or advisable, step 266 then generates boot data that is subsequently pre-fetched to a boot tier to undergo hierarchy evaluation in accordance with loop 240 of FIG. 5. Step 266 is not limited to the generation of new user data, like new passwords and identifiers, as data may be combined, such as the combination of metadata with encryption keys. The generation of boot data in step 266 may also consolidate metadata by eliminating redundancy and superfluous aspects, such as out-of-date physical-to-logical (PBA to LBA) transitions.

Figure 7:
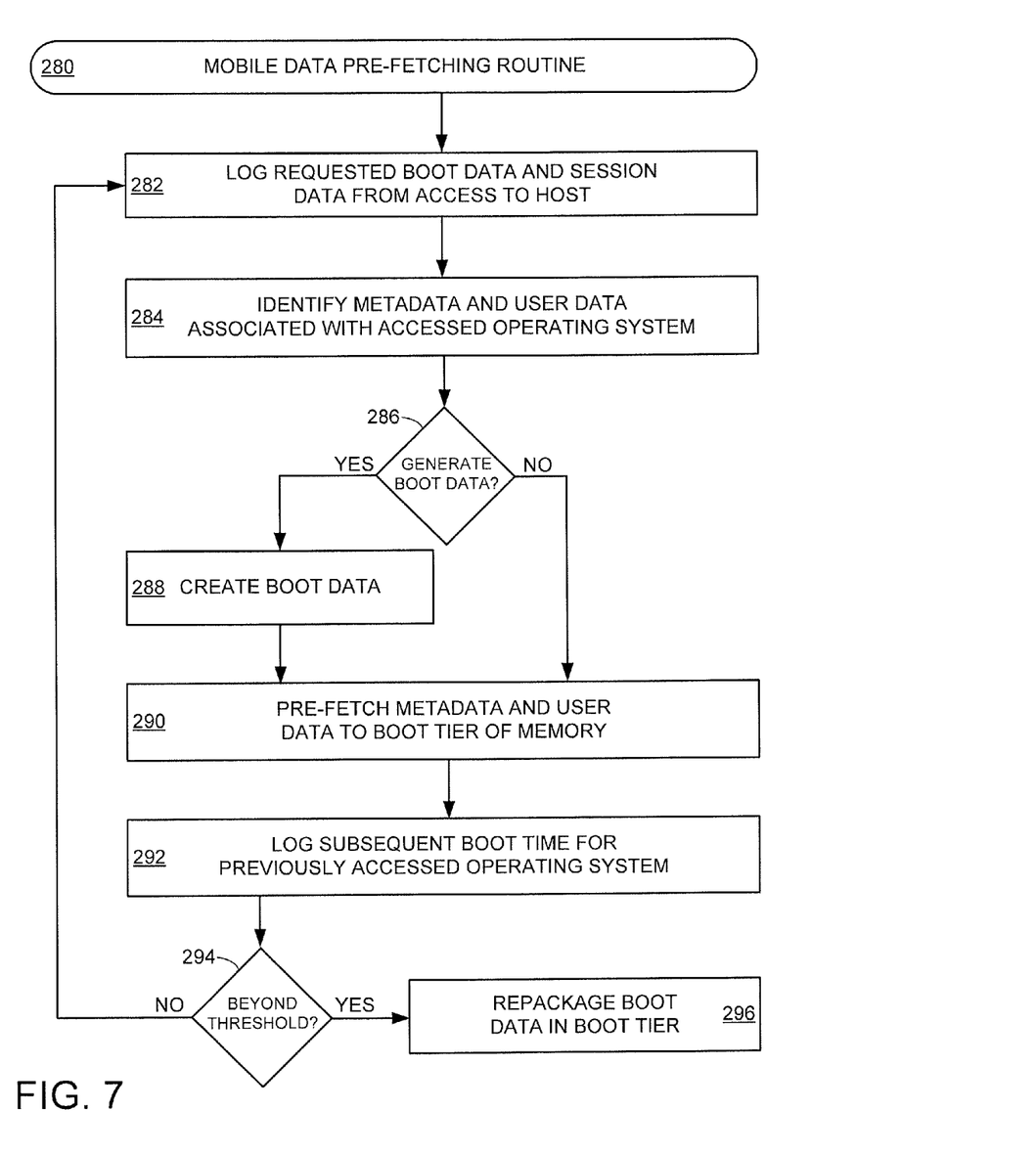
FIG. 7 provides a flowchart for an example magnetic element fabrication routine conducted in accordance with various embodiments.

The ability to identify potential consolidations and combinations of various portions of boot data can provide continually improving system boot times as increasing amounts of boot operations are logged and analyzed. Such boot data manipulations can further be catered to mobile data storage environments that allow users to physically transport sensitive personalized user data instead of storing the data in potentially compromised remote storage environments, like a data storage cloud. FIG. 7 provides an example mobile data pre-fetching routine 280 that is conducted in accordance to various embodiments to cater boot data to a mobile data storage environment.

While the pre-fetching routine 280 can be conducted in a variety of non-mobile data storage devices, step 282 can log requested boot and session data from access to a remote host to capture information specific to mobile data storage devices. With mobile devices, securely and quickly conveying the identity and purpose of the device can be time consuming. Hence, step 282 logs the boot and session data during a remote host access to allow subsequent booting operations to be conducted with data being provided to the host before the host requests the data. That is, instead of the mobile device and remote host swapping data requests with data, the mobile device can load all the boot data prior to the data being requested while providing session and security data, such as encryption keys, that verify the validity and identity of the mobile device.

With the initial log of boot and session data from step 282, step 284 can then parse the data stream to identify the metadata and personalized user data associated with the accessed operating system. Such identification can access existing operating system lists to identify the operating system and the associated boot data from an existing table without having to populate and analyze the entire logged boot and session data stream. Regardless of whether the host operating system is recognized, the metadata and user data identified in step 284 from the logged boot and session data of step 282, can be analyzed to determine if boot data can be modified and combined to increase booting efficiency.

Decision 286 takes the identified metadata and user data from 284, along with any possible data modifications and combinations, to evaluate if boot data can be generated to complement or replace boot data. For instance, a metadata look-up table may be created to correlate various metadata and optimize booting speed without being prompted for the table by the remote host. If boot data is deemed to be prudent, step 288 proceeds to create the boot data, which may be metadata, personalized user data, session data, and combinations thereof.

The creation of boot data from step 288 and a determination to not create boot data from decision 286 each advance routine 280 to step 290 where boot data is pre-fetched from various memory tiers to a boot data memory tier, as displayed in FIG. 4. The consolidation of metadata and personalized user data that has been previously requested and identified in steps 282 and 284 can be complemented with proactively pre-fetched boot data predicted to be requested by a remote host. Such predicted pre-fetched boot data can also take the form of security data that identifies and validates access of the mobile data storage device to the network and the specific host node.

With previously identified boot data and any predicted data consolidated into a common tier of memory, step 292 subsequently logs the next boot time for the previously accessed host operating system. The host node accessed in step 292 does not have to be the same node that was logged in step 282, but the boot time for the same operating system is logged and compared to any predicted boot time thresholds in decision 294, as illustrated in FIGS. 5 and 6. A determination that the boot data in the boot data memory tier results in boot times beyond the predetermined threshold proceeds to step 296 where at least the pre-fetched data is repackaged with different metadata and personalized user data being moved to the boot data memory tier.

In the event the logged boot time from step 292 meets or exceeds expectations, decision 294 returns routine 280 to step 282 where access to a remote host operating system is logged. Through the continuous loop of logging requested boot data and pre-fetching boot data to improve booting speed, a mobile data storage device can ensure increasingly faster boot times for a variety of different host operating systems. It should be noted, however, that the various steps and decisions of routine 280 shown in FIG. 7 are not required or limited as the various decisions and steps can be omitted, changed, and added. As an example, a step can be inserted between steps 290 and 292 that evaluates identified boot data from step 284 and pre-fetched boot data from step 290 to predict future boot times.

The management of metadata and personalized user data can provide increasingly fast boot times in local and remote network nodes. The ability to consolidate boot data to a common memory tier that has a memory type conducive to fast data loading can allow boot data to be loaded and ready prior to the host node requesting the information. The analysis of previously requested boot data to identify how metadata and user data can be manipulated and proactively pre-fetched allows the boot data to evolve to changing operating conditions to provide nearly instantaneous boot times. Moreover, the boot data can be catered to a mobile data storage environment with security and session data that identifies and validates the mobile device's access to a network without having to store personalized user data in a potentially compromised storage space, like a cloud.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. A method comprising:
   directing data to first and second tiers of memory in a mobile data storage device with a controller;
   pre-fetching boot data to the first tier of memory from the second tier of memory, the boot data comprising metadata and personalized user data, the personalized user data comprising at least one of new passwords and user identifiers;
   loading the personalized user data from the first tier of memory to a node of network in response to establishing of a connection between the mobile data storage device and the node, the loading of the personalized user data and the metadata provide boot times of less than one second;
   calculating a predicted boot time for the pre-fetched data based on size of the pre-fetched data, the type of the first tier memory, and historical boot latency;
   comparing a recorded actual boot time to the predicted boot time,
   if the actual boot time is less than the predicated boot time,
       maintain the pre-fetched boot data in the first tier of memory,
   if the actual boot time is greater than the predicted boot time, but less than a maximum threshold,
       return the pre-fetched boot data in the first tier of memory to the second tier of memory
   if the actual boot time is greater than the maximum threshold,
       upgrade the pre-fetched boot data to a higher tier of memory.

2. The method of claim 1, wherein session data stored in the first tier of memory is subsequently loaded in response to a power failure to resume user access to the node of the network seamlessly.

3. The method of claim 1, wherein logs of metadata updates are used to predict an operating system used by the node of the network.

4. The apparatus of claim 1, wherein the personalized data is loaded, but not stored in the network.

5. An apparatus comprising
   a mobile data storage device with a controller directing data to first and second tiers of memory,
   pre-fetch boot data to the first tier of memory from the second tier of memory, the boot data comprising metadata and personalized user data, the personalized user data comprising at least one of new passwords and user identifiers;
   load the personalized user data from the first tier of memory to a node of network in response to establishing of a connection between the mobile data storage device and the node, the loading of the personalized user data and the metadata provides boot times of less than one second;
   calculate a predicted boot time for the pre-fetched data based on size of the pre-fetched data, the type of the first tier memory, and historical boot latency;
   compare a recorded actual boot time to the predicted boot time,
   if the actual boot time is less than the predicated boot time,
       maintain the pre-fetched boot data in the first tier of memory,
   if the actual boot time is greater than the predicted boot time, but less than a maximum threshold,
       return the pre-fetched boot data in the first tier of memory to the second tier of memory
   if the actual boot time is greater than the maximum threshold,
       upgrade the pre-fetched boot data to a higher tier of memory.

6. The apparatus of claim 5, wherein the first and second tiers of memory comprise different types of non-volatile, non-flash memory.

7. The apparatus of claim 5, wherein at least one of the first and second tiers of memory comprises PCRAM cells.

8. The apparatus of claim 5, wherein at least one of the first and second tiers of memory comprises RRAM cells.

9. The apparatus of claim 5, wherein at least one of the first and second tiers of memory comprises PCM cells.

10. The apparatus of claim 5, wherein the boot data further comprises session and security data.

11. The apparatus of claim 5, wherein the personalized user data is unique to a predetermined user.

12. The apparatus of claim 5, wherein the first tier of memory comprises a plurality of sub-tiers each comprising different memory types.

13. A system comprising
    a mobile data storage device,
    a multi-tiered memory,
    a memory controller comprising
    pre-fetch boot data to the first tier of memory from the second tier of memory, the boot data comprising metadata and personalized user data, the personalized user data comprising at least one of new passwords and user identifiers;
    load the personalized user data from the first tier of memory to a node of network in response to establishing of a connection between the mobile data storage device and the node, the loading of the personalized user data and the metadata provide boot times of less than one second;
    calculate a predicted boot time for the pre-fetched data based on size of the pre-fetched data, the type of the first tier memory, and historical boot latency;
    compare a recorded actual boot time to the predicted boot time, if the actual boot time is less than the predicated boot time,
  maintain the pre-fetched boot data in the first tier of memory,
if the actual boot time is greater than the predicted boot time, but less than a maximum threshold,
  return the pre-fetched boot data in the first tier of memory to the second tier of memory
if the actual boot time is greater than the maximum threshold,
  upgrade the pre-fetched boot data to a higher tier of memory.

14. The system of claim 13, wherein the boot data being pre-fetched are based on previously logged data accesses to a host node.

15. The system of claim 14, wherein the controller creates personalized data in response to the logged data accesses to a host node.

16. The system of claim 15, wherein the created personalized data combines at least identification and password content for a predetermined operating system.

17. The system of claim 13, wherein the pre-fetched boot data is returned to the second tier of memory in response to a boot time exceeding a predetermined threshold.

18. The system of claim 13, wherein the first tier of memory comprises multiple sub-tiers each containing combinations of metadata and personalized user data corresponding to different host operating systems.

19. The system of claim 13, wherein the metadata corresponds to a unique predetermined operating system.

* * * * *